United States Patent [19]
Marsh et al.

[11] Patent Number: 5,596,322
[45] Date of Patent: Jan. 21, 1997

[54] REDUCING THE NUMBER OF TRIM LINKS NEEDED ON MULTI-CHANNEL ANALOG INTEGRATED CIRCUITS

[75] Inventors: Douglas G. Marsh, Bethlehem; Robert H. Vaiden, Allentown, both of Pa.

[73] Assignee: Lucent Technologies Inc., Murray Hill, N.J.

[21] Appl. No.: 329,590

[22] Filed: Oct. 26, 1994

[51] Int. Cl.$^6$ ............................. H03M 1/10; H03G 3/00
[52] U.S. Cl. ........................ 341/120; 341/143; 341/118
[58] Field of Search ................................ 341/118, 120, 341/143

[56] References Cited

U.S. PATENT DOCUMENTS

| | | |
|---|---|---|
| 4,777,471 | 10/1988 | Comer . |
| 4,794,343 | 12/1988 | Yang ............................................. 330/2 |
| 5,248,970 | 9/1993 | Sooch et al. ............................... 341/120 |

FOREIGN PATENT DOCUMENTS

| | | |
|---|---|---|
| 0130716A2 | 1/1985 | European Pat. Off. . |
| 0348123A1 | 12/1989 | European Pat. Off. . |
| 3110800A1 | 3/1981 | Germany . |
| WO92/00630 | 1/1992 | WIPO . |

OTHER PUBLICATIONS

AT&T "T7531 and T7535 Chip Set 16-Channel Programmable PCM Codec" 4 pages.
Goodenough "12-Bit IC ADCs Guarantee ± LSB From -55° To +125° C." Preliminary Data Sheet, Aug. 30, 1994, pp. 1–39.

Primary Examiner—Howard L. Williams
Assistant Examiner—Peguy JeanPierre

[57] ABSTRACT

A method and structure for automatically calibrating various paths within multi-channel analog integrated circuits is disclose. The invention calls for digital signal processing circuitry to correct for absolute gain differences in the multiple channels. A first reference channel is precision trimmed at manufacture and used by the digital processing circuitry as a reference for channel gain calibration. When the circuit is powered for use, the other channels are calibrated based on the trimmed and calibrated reference. The need for providing the circuitry to precision trim all other channels but one is avoided by this invention.

17 Claims, 5 Drawing Sheets

REDUCING THE NUMBER OF TRIM LINKS NEEDED ON MULTI-CHANNEL ANALOG INTEGRATED CIRCUITS

BACKGROUND OF THE INVENTION

1. Field of the Invention

The present invention relates to calibration of channel gain within multi-channel analog integrated circuits.

2. Description of the Related Art

Recently, considerable interest has developed in analog circuitry that can be shared (multiplexed) across a number of channels. As the number of shared channels increases, e.g., channels shared by a digital signal processor (DSP), the amount of circuit area required by resistive elements becomes critical.

Trim link circuitry embodies resistive elements used to compensate for variances in resistive values (and therefore, gain) typically found throughout replicated portions of semiconductor circuits. To compensate for varying gains, adjustable values of resistor elements are trimmed. Trimming includes blowing fuses within resistive paths to vary the surface area of the resistor formed therewith, thereby upgrading and equalizing device gain.

One example of resistor trimming circuitry is disclosed in U.S. Pat. No. 4,777,471, owned by Precision Micro Devices, Inc., of San Jose, Calif. The trimming circuitry disclosed therein is suitable for adjusting gains within a variety of precision integrated circuits. FIG. 1 shows a portion of trimming circuitry which utilizes avalanche breakdown to fuse trim links. In the figure, a terminal A electrically connects a first end of a resistor R1, a cathode end of zener diode $Z_1$ and a Pad P1. A second end of resistor $R_1$ electrically connects to an anode end of diode $Z_1$, via resistor $R_4$, and to first ends of resistors $R_3$ and $R_5$. Anode end of diode $Z_1$ electrically connects to an anode end of zener diode $Z_2$. Cathode end of diode $Z_2$ electrically connects to a second end of resistor $R_5$ and a Pad P2, and the second end of resistor $R_3$ electrically connects to terminal B.

During trimming, a high current pulse is applied from Pad P1 to Pad P2, utilizing the device's inherent avalanche breakdown characteristics and shorting diode $Z_1$. With $Z_1$ shorted, $R_{AC}=R_1R_4/(R_1+R_4)$. To further trim the resistance, a current pulse is applied from Pad P2 to Pad P1 shorting diode $Z_2$ and rendering $R_{AC}=1/(1/R_4+1/R_4+1/R_5)$.

While this or similar trimming mechanisms both accurately and efficiently adjust gain, considerable substrate area is consumed to fabricate the required resistors, diodes and pads. As the number of channels increase, the required trimming increases. Increased trimming renders fabrication more complex, both during manufacture and calibration testing. Trimming requirements for multiple channels also increases the number of probe contacts required to make contact with the trim links, the need to verify continuity of the trim links, the frequency of which probe contacts must be cleaned, the large number of relays required for automatic testing, and the time required for testing.

SUMMARY OF THE INVENTION

This invention provides for a reduction in the number of trim links needed to calibrate multi-channel analog integrated circuits. The reduction makes available circuit substrate area normally used to support trim links in conventionally designed shared-channel circuitry. In one form of the invention, a method is provided which includes adjusting trim links to permanently calibrate the gain of only one of a plurality of channels forming a multi-channel circuit. The adjusted channel is then used as a reference to compare the gains of the remainder of the circuit's channels. Gain trimming circuitry, therefore, need not be provided for the remainder of the circuit's channels. Calibration coefficients defining gains needed to match each channel's gain to the gain of the reference channel are generated pursuant to the comparison. The coefficients are preferably stored for use in calculations performed on data derived from each channel.

A preferred form of the invention provides a multiplicity of analog/digital (A/D) and digital/analog (D/A) converters and a digital signal processor, in a combination, forming a multi-channel (N-channel) codec. The N-channel codec includes trimmable circuitry for only one A/D or D/A section contained within each converter forming the codec. The one trimmable A/D or D/A section is calibrated, preferably at die testing, using the channel's trimmable circuitry for use as a reference to provide a basis for generating calibration coefficients to calibrate the gains of the remaining paths.

The elimination of the need to provide trimming circuitry, and therefore to provide testing to trim each channel of a multi-channel analog circuit, provides a number of benefits. For example, the elimination of the large number of probe contacts and trim links normally required simplifies the device's design and calibration, and lends itself to miniaturization. The commensurate savings in both manufacturing cost and test time, especially as the number of channels increases, is considerable. The trimmed reference channel (or path) may also be used to provide a precision signal source or known reference for use by other portions of the circuitry.

DETAILED DESCRIPTION

Calibration of a single channel of an analog integrated circuit using traditional resistive trimming techniques is shown to effectively and accurately calibrate the channel's gain, to within, e.g., ±20 mdB. Such calibration, however, becomes cumbersome and costly where multiple channels must be calibrated. The present invention provides for calibrating multiple channels of an analog semiconductor circuit by first trimming one path or channel within the circuit using conventional methods, and then utilizing the trimmed channel as a reference to calculate coefficients to calibrate the non-trimmed channels.

Conventional single channel codecs (for example, T7513, T7517, T7570, T5570 and T7548, manufactured by AT&T Corp., Microelectronics, Allentown, Pa.) use trim link circuitry at the wafer test level to match tolerances of each component of the codec and assure a ±180 mdB absolute accuracy. Absolute accuracy refers to the overall tolerance which accounts for all variances resulting from packaging, temperature and power supply variations.

Figure 1:
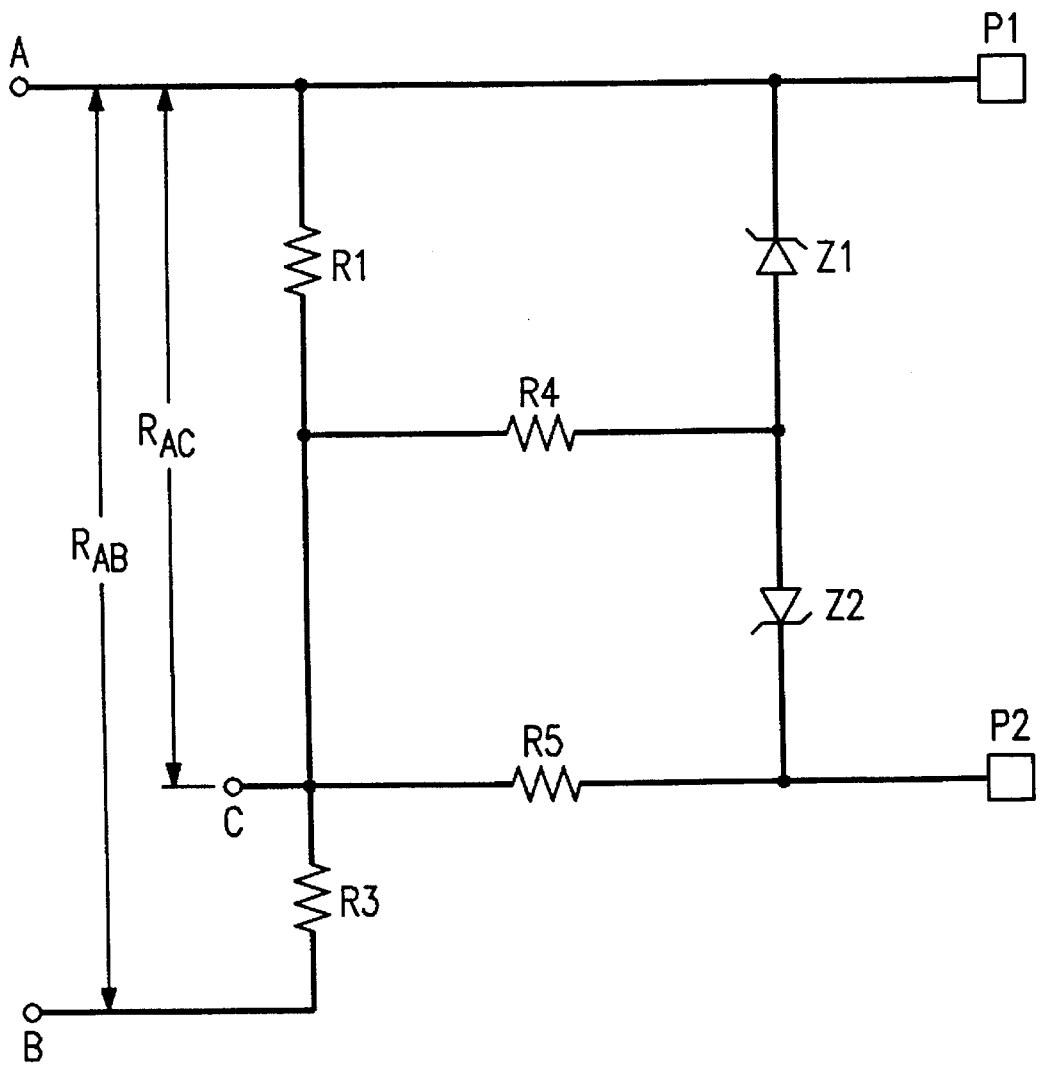
FIG. 1 is a schematic diagram of a portion of an analog integrated circuit utilized in a conventional trimming process.
Figure 2:
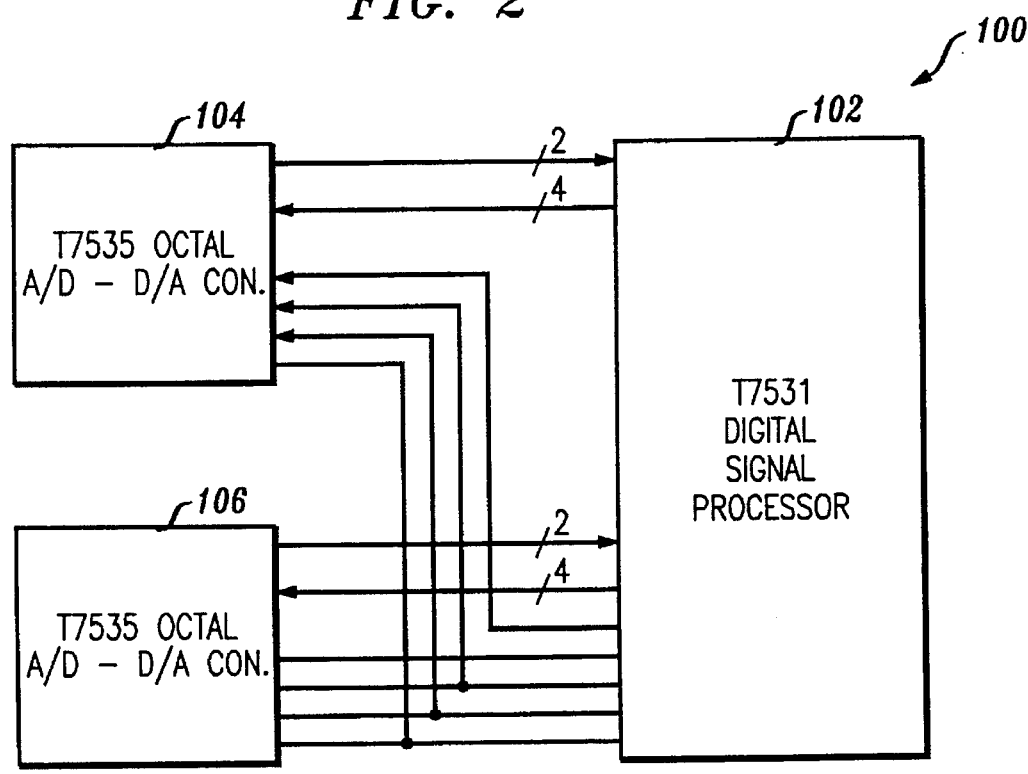
FIG. 2 is a system block diagram of a preferred embodiment of a multi-channel, analog integrated circuit of this invention.

A preferred form of the invention is a 16-channel programmable pulse-code modulated (PCM) codec 100 shown in FIG. 2. Codec 100 is realized by the T7531/35 chip set, manufactured by AT&T. The T7531/35 chip set includes a T7531 digital signal processor (DSP) 102 and two T7535 octal A/D-D/A converters 104, 106. The T7531/35 chip set is described in great detail in the preliminary data sheet published Apr. 15, 1994, by AT&T and incorporated herein by reference. The programmable features of the codec (including each T7535) are per channel, each of which includes individual transmit and receive gain adjustments. Like the single channel codecs, the analog gain precision required per channel for the T7531/35 chip set is approximately ±180 mdB (±2%) of absolute accuracy in either the analog-digital or digital-analog converter direction.

A novel feature of the 16-channel programmable codec 100 includes the need to precision trim only one direction (A/D or D/A path) of one channel of each of the T7535 line card octal A/D-D/A converters 104, 106. The trimmed path is then used as a reference and utilized by the DSP to calibrate the other 15 channel paths contained within each converter. The DSP 102 calibrates the untrimmed channel paths by placing a known voltage signal across each path to generate an output signal and comparing the output signals generated within the untrimmed paths to the output signal generated within the trimmed path. Effective gains needed to calibrate each untrimmed path are determined thereby. The DSP 102 preferably includes the gains as additional coefficients for use during processing. It is estimated that 50 trim links would be required to calibrate each of the 8 channels within each T7535 using conventional trimming practices. The considerable chip area and number of probe pads required to implement 50 trim links on each converter would likely result in production problems in high volume manufacture. Such problems are avoided by this invention.

Figure 3:
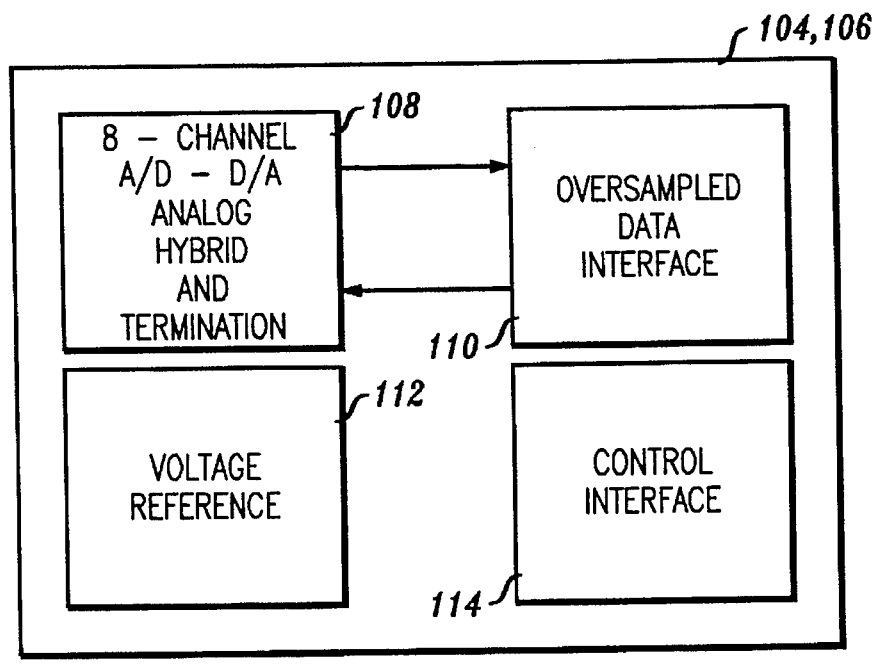
FIG. 3 is a block diagram of an octal converter, included within the circuit of FIG. 2.

A block diagram of a T7535 octal converter 104, 106 is shown in FIG. 3. The converter includes an eight channel A/D and D/A section combined with analog hybrid and termination 108, an oversampled data interface 110, a voltage reference 112, and a control interface 114. Each converter's eight channels communicate with an oversampled data interface 110. The digital data generated within each channel's A/D path are multiplexed via interface 110 to DSP 102. Data generated within the DSP is multiplexed to the D/As via interface 110. Control interface 114 accepts control data from the DSP for activating the various gain settings, loop-back and power down modes of each converter. Voltage reference 112 is a precision band gap voltage reference for use by the converter that is trimmed with the first channel path calibration.

Figure 4:
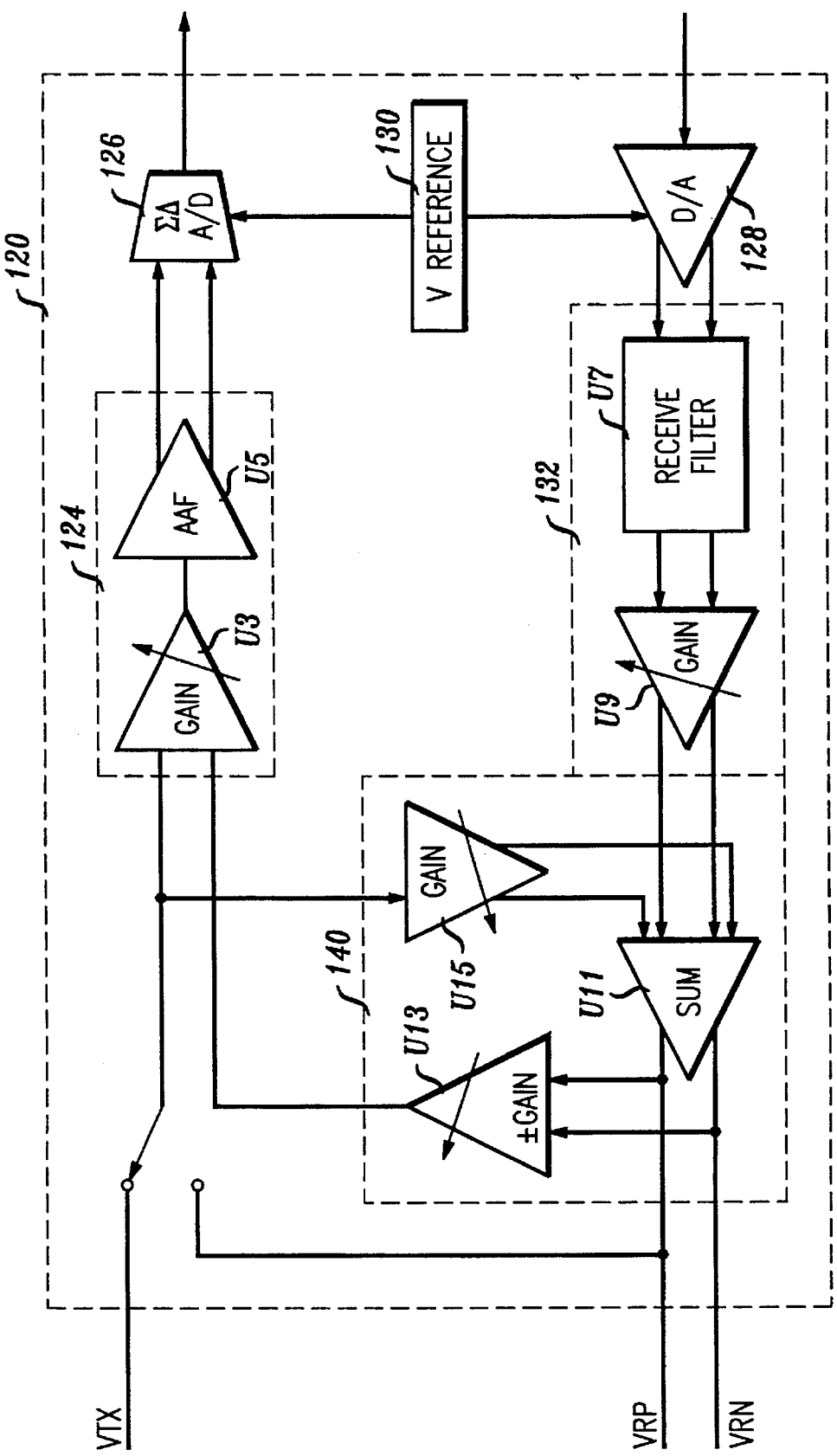
FIG. 4 is a block diagram of a single signal processing channel of the octal converter of FIG. 3.

FIG. 4 is a schematic block diagram highlighting one channel 120 of the eight channels comprising each of converters 104, 106. Channel 120 includes an input stage 124 formed with a variable gain amplifier U3 and a anti-aliasing filter U5. Analog data received, amplified and filtered at the input stage 124 is provided to a sigma-delta (ΣΔ) A/D converter 126. Digital data is generated (coded) from the analog input within the A/D converter and passed to DSP 102 for processing (via interface 110). A D/A converter 128 receives digital data from DSP 102 (via interface 110) for transformation (decoding) to analog form. A voltage reference (band gap) 130 is electrically connected to A/D and D/A converters 126, 128, respectively. The voltage reference is used to set the maximum voltage levels (rails) for each path with varying conditions. Filter 132 comprises a receive filter U7 and a variable gain stage U9. An analog hybrid selectable gain stage 140, electrically connected to filter 132, includes a summer U11, a hybrid gain amplifier U13 and a variable gain amplifier U15. The summer U11 and the gains of U13, U14 are controlled via the DSP 102, as are the loopback configurations for various codec calibration modes.

Figure 5:
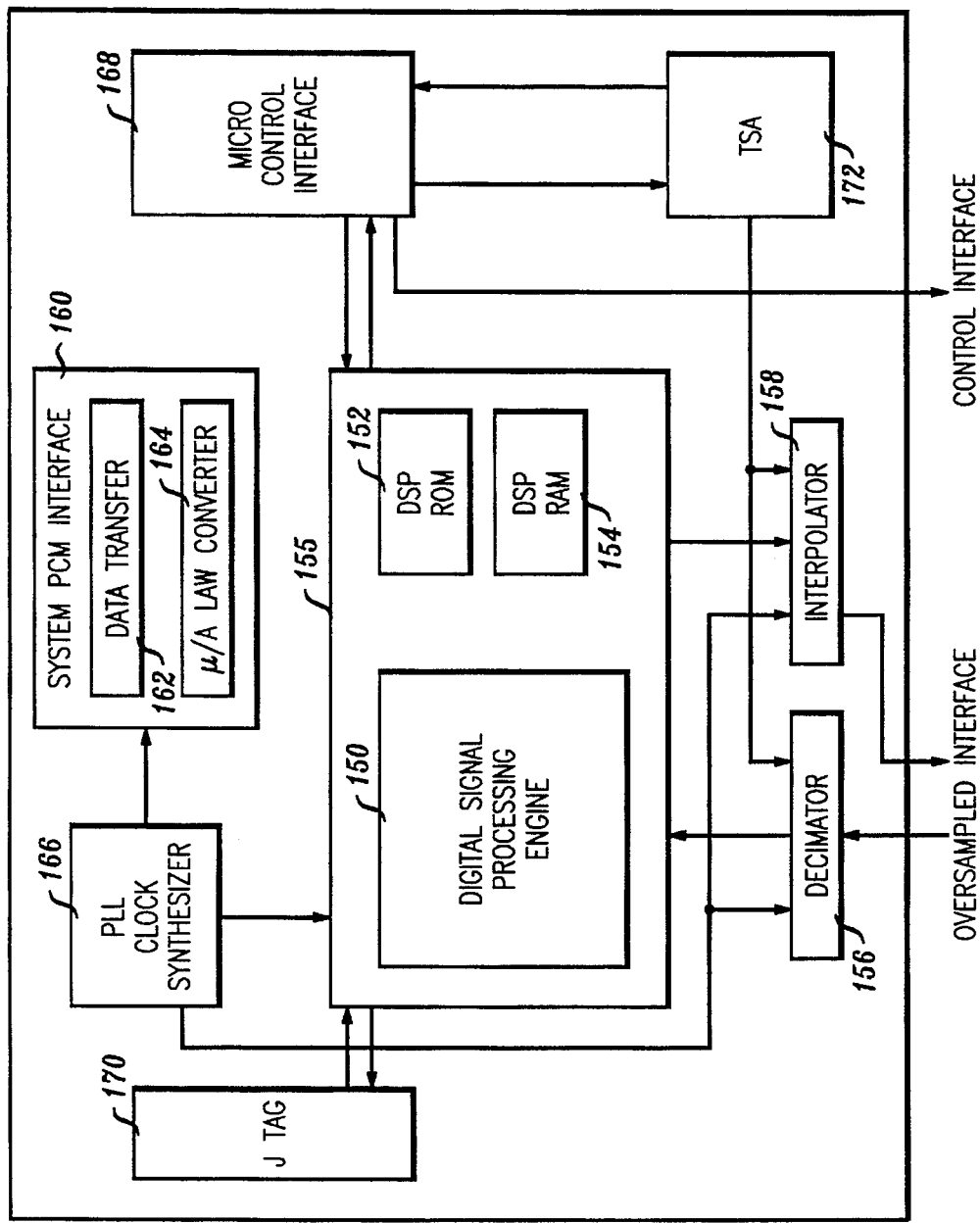
FIG. 5 is a block diagram of a digital signal processor included within the circuit of FIG. 2.

FIG. 5 shows a more detailed block diagram of the DSP 102 of FIG. 2. A DSP block 155 includes DSP engine 150, a DSP ROM 152 and a DSP RAM 154. Decimator 156 and interpolator 158 communicate directly with DSP block 155 to process the sigma-delta digital bit streams emanating from the oversampled data interface 110 of each converter 104, 106. The decimator and interpolator are also in electrical communication with a time slot assignment TSA 172 which synchronizes the time positioning of the serial data of each channel to and from the DSP. A system PCM interface 160 includes a data transfer block 162 and a μ-Law and A-Law converter 164. Clock synthesizer 166 synthesizes all the required internal clocks for the DSP and the A/Ds and D/As from the clock input provided on the system interface. A joint access test group (JTAG) 170 interface is included for testing. JTAG 170 communicates directly with DSP block 155. The microcontrol interface 168 is in communication with the system PCM interface 160, DSP block 155, TSA 172 and T7535 control interface 114. All the gain and balance network settings, termination impedance settings, power-up/power-down commands, time slot assignments, digital loopback settings and commands for each of T7535 octal converters 104, 106 are provided through the microcontrol interface 168.

During testing shortly after manufacture, the voltage reference and one path of a first channel (e.g., D/A1) of each T7535 converter 104, 106 is calibrated via conventional trimming techniques. The choice of the path for precision trimming is not limited, however, to an D/A path. An A/D path, i.e., A/D1, can be trimmed for use as a reference within each converter without deviating from the scope of this embodiment. The means for trimming the path of the first channel may be any known to those skilled in the art.

When the codec is powered up, the DSP 102 initiates and controls a calibration routine or procedure for calibrating each of the remaining channels of each converter 104, 106. One way this may be accomplished is by providing a known voltage signal generated by the DSP and applied to the trimmed D/A path (i.e., D/A1). The resultant analog converted signal is then provided (by routing) throughout the circuit to each of the A/D input paths. Any in-band wave may be generated for use as the input reference. Each of the digital outputs of the non-trimmed channel paths are then compared to the expected output produced by an ideal A/D. The gains needed to calibrate the non-trimmed channel paths relative to an ideal path are generated and preferably stored within the DSP 102.

In order to now calibrate the untrimmed D/A paths, the digitally generated signal is applied to each D/A input. The signals generated and output in response to the digital reference signal are connected via a loop-back mode directly to each channel's corresponding and previously calibrated A/D input path. The DSP 108 then compares and equates the responses generated in response thereto at each A/D output (provided to the DSP) and adjusts the D/A gains for each channel accordingly. The expected (calibration target) output is known since the DSP generates the signal provided to the D/As and compares the received digital signal to the generated digital signal at the D/A input. Any D/A path gain error is thereby adjusted and compensated for. The known calibration coefficients may be stored and subsequently used.

As mentioned above, it may be prudent at times to begin calibration with A/D1 instead of D/A1, for example, pursuant to a need to improve calibration time. The A/D1 signal used to scale the other non-trimmed A/D paths need not be generated explicitly. It could be generated with the converter 104, 106 simply by toggling between two dc voltage levels. The output signals of all untrimmed A/D paths are compared to the signal output from the trimmed path by the DSP 102 and calibration coefficients corresponding thereto are calculated and stored. Each D/A output path is then connected via loop-back to its own A/D input path. The DSP applies a digital representation of a voltage signal to each D/A input and compares that channel's A/D output signal to the expected signal level. D/A calibration coefficients are calculated and preferably, subsequently stored based on the comparison.

It is envisioned that a calibration improvement might be obtained by individually routing the D/A output signals back through the trimmed A/D1 path. However, care must be taken in utilizing such a scheme because of the increased routing and test time which it would impose. While the signal generated by the DSP 102 is not envisioned to be limited by frequency, a 1.02 kHz sine wave is found to show minimal effects due to slew rate distortion, and is preferably used in the above described embodiment.

Figure 6:
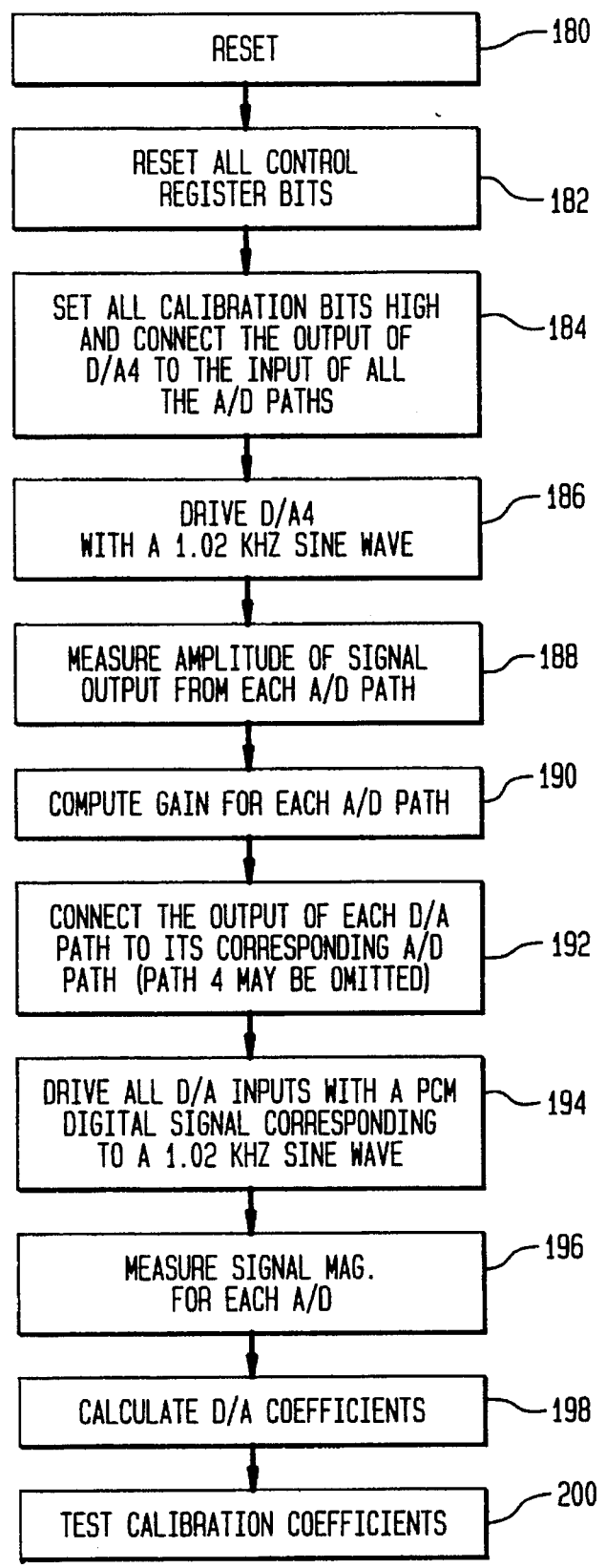
FIG. 6 is a flow diagram identifying the steps required for performing the process of the invention.

FIG. 6 is a flow diagram identifying one method of calibrating the channels of a codec 100 of this invention. The method presupposes that one channel, i.e., path D/A4 of the fourth channel, has been trimmed at wafer probe to adjust its gain. The coefficient for trimmed path D/A4 of channel 4 may therefore be normalized to 1. Coefficients for the other channels will be generated relative to the normalized gain of the pre-calibrated channel path D/A4.

Flow block 180 of FIG. 6 represents a step that includes resetting converters 104, 106, and synchronizing the oversampled data interface 110 for each converter. The DSP 102 carries out the tasks represented by flow block 180. The next step, represented by flow block 182, calls for the power-up of each channel. To accomplish this, all data bits in a control register (not shown) of each converter 104, 106, are set to zero for each channel via DSP 102. Flow block 184 represents the step where each calibration bit of the control register is set high, which is an arbitrary state, and the output of each D/A4 is connected to the input of each A/D path. Each calibration bit corresponds to a channel within each converter.

The next step requires driving the fourth channel (path D/A4) with a 0 dbm 0 digital sine wave, represented by flow block 186. In a preferred form, this 0 dbm 0 digital sine wave produces an analog 1020 Hz sine wave signal and provides the signal at the VRP output of approximately 0.983 Vrms. This output signal is fed to each A/D input. The signal amplitude on each A/D channel output (each transmit sigma-delta bit stream) is measured and compared against the expected value in the next step, represented by flow block 188. The expected value is calculated on the assumption that the internal gains are error free. The gain coefficients are then computed for each A/D channel path, as represented by flow block 190.

The next step requires the DSP 102 to set the loop-back of each D/A output to its corresponding input within converters 104, 106, (driving the fourth channel is optional) represented by flow block 192. Block 194 represents the next step which calls for driving each channel with a PCM 0 dBm digital sine wave. Flow block 196 represents the step of measuring the signal amplitude for each A/D channel 128 (FIG. 4) output, and comparing the measured value to the reference value, i.e., the normalized reference or expected value of the fourth channel.

Gain correction coefficients for each D/A path are then calculated within the DSP 102 using the A/D calibration coefficients, as represented by flow block 198. The coefficient of channel four is unity by definition. Flow block 200 represents a step in which the DSP tests the calibration coefficients to determine whether they are within an acceptable range. If falling outside the acceptable range, a flag is generated within the DSP corresponding to that channel in which calibration has failed. If it is determined that the gain of all the channels can be calibrated within the acceptable range (e.g., 0.975 to 1.025), the corresponding calibration coefficients may be stored for use by the DSP 102 for use during processing of data derived from each channel.

This invention has been described particularly with reference to the 16 channel codec 100 formed of the T7531/35 chip set, the preferred embodiment. The invention, however, is applicable to any device formed with more than one channel (i.e., a replicated circuit) that might benefit from having trim circuitry contained within the device at a minimum. The device would merely require some sort of processing means, such as a microcontroller, ASIC, PGA or like circuitry capable of calibrating the replicated circuitry, and generating, storing and using calibration coefficients represented thereby. In some instances, logic may be simplified if square waves or other waveforms (digital or analog) are used in place of a sine wave.

What has been described herein is merely illustrative of the application of the principles of the present invention. Other arrangements and methods may be implemented by those skilled in the art without departing from the scope and spirit of this invention.

What is claimed is:

1. A method of calibrating channel gain within a multi-channel analog device, said device having an analog/digital (A/D)-digital/analog (D/A) converter comprising N channels and also having a digital processor for controlling a gain of each said N channels, said method comprising the steps of:

a) adjusting a component within a first channel to calibrate said first channel's gain for use within said device as a base reference;

b) determining gains within second through $N^{th}$ channels at device initialization relative to said base reference; and c) automatically generating gain correction coefficients in accordance with said determining to calibrate said second through N channels.

2. The method defined by claim 1, wherein said step of adjusting includes precision trimming a component within said first channel.

3. The method defined by claim 1, wherein said step of automatically generating includes storing said correction coefficients.

4. The method defined by claim 1, wherein said step of determining includes providing a test signal to each of said N channels and comparing output signals generated within said second through $N^{th}$ channels to an output signal generated within said first channel.

5. The method defined by claim 4, wherein said step of determining includes providing a known test signal at an in-band frequency.

6. The method defined by claim 1, wherein said digital processor comprises a digital signal processor (DSP).

7. The method defined by claim 6, wherein said step of adjusting further includes determining a first signal representing a gain of one of: a first A/D converter channel direction and a second D/A converter channel direction of said first channel.

8. The method defined by claim 7, wherein said step of determining further includes generating second through $N^{th}$ signals representative of said determined converter channel direction and applying said signals to each non-determined converter directions of each said second through N channels, respectively.

9. The method defined by claim 1, further comprising the step of determining within said DSP whether each of said gain correction coefficients is within a predetermined range.

10. An analog integrated circuit comprising N channels, each of said N channels including an analog to digital (A/D) converter path and a digital to analog (D/A) converter path, wherein a component within a first of said N channels is precisely adjusted at wafer probe testing to fix a corresponding gain within said first channel, said circuit comprising:

a) generating means for generating a first through $N^{th}$ output signal within said first through $N^{th}$ channels, respectively;

b) gain determining means for comparing said output signals to determine a relative gain associated with each of said N channels; and c) calibration means responsive to said determined relative gains for generating calibration coefficients for use in normalizing gains within each channel.

11. The analog integrated circuit defined by claim 10, further including storage means for storing said calibration coefficients.

12. The analog integrated circuit defined by claim 10, wherein said first output signal is generated within an A/D path of said first channel, and wherein said D/A path of said first channel is responsive to said first output signal.

13. The analog integrated circuit of claim 10, wherein said first output signal is generated with a D/A path of said first channel, and wherein said A/D path of said first channel is responsive to said first output signal.

14. The analog integrated circuit of claim 10, including a digital signal processor.

15. A codec comprising N channels, wherein each of said N channels includes an analog to digital (A/D) conversion path having a first analog amplifier in series with an A/D converter, and a digital to analog (D/A) conversion path having a D/A converter in series with a second analog amplifier, and wherein a gain of a first one of said A/D paths has been calibrated by trimming during codec fabrication, said codec further comprising:

a) means for providing a digital calibration signal to said D/A paths;

b) first loopback means for sequentially providing D/A path output signals generated in response to said digital calibration signal being applied to each said N D/A paths, said D/A path output signals being sequentially applied as inputs to said first calibrated A/D path;

c) first means for assessing, in sequence, output signals of said calibrated A/D path generated in response to each said sequential inputs, wherein N D/A path calibration coefficients are sequentially determined;

d) second loopback means for providing an analog calibration signal from at least one of said D/A paths to each said A/D path; and e) second means for assessing N A/D path output signals that are generated in response to said analog calibration signal, wherein second through $N^{th}$ A/D path calibration coefficients are determined.

16. A codec comprising N channels, wherein each of said N channels includes an analog to digital (A/D) conversion path having a first analog amplifier in series with an A/D converter, and a digital to analog (D/A) conversion path having a D/A converter in series with a second analog amplifier, and wherein a gain of one of said A/D paths has been calibrated by trimming during codec fabrication, said codec further comprising:

a) analog means for providing an analog calibration signal to each said N A/D paths;

b) first comparing means for comparing (N–1) A/D path output signals generated within (N–1) corresponding ones of said non-calibrated A/D paths in response to said analog calibration signal with an output signal generated by said calibrated A/D path in response to said analog calibration signal, wherein A/D gain correction coefficients are determined;

c) digital means for providing a digital calibration signal to each said N D/A paths;

d) loopback means for providing analog D/A path output signals generated in each said N D/A paths in response to said digital calibration signal, respectively, to at least one of said N A/D paths; and e) second comparing means for comparing N digital signals generated within said at least one A/D path, responsive to said D/A path output signals, wherein N D/A calibration coefficients are determined.

17. A codec comprising N channels, wherein each of said N channels includes an analog to digital (A/D) conversion path having a first analog amplifier in series with an A/D converter, and a digital to analog (D/A) conversion path having a D/A converter in series with a second analog amplifier, and wherein a gain of one of said D/A paths has been calibrated by trimming during codec fabrication, said codec further comprising:

a) means for generating an analog calibration signal output of said trimmed D/A path responsive to a calibrated digital signal being applied to said trimmed D/A path, and providing said analog calibration signal to each said N A/D paths;

b) means for comparing signals generated within said N A/D paths in response to said analog calibration signal, wherein A/D path calibration coefficients are determined;

c) loopback means for directing N D/A path output signals to at least one of said N A/D path inputs while applying said digital calibration signal to each said D/A path input; and d) means for comparing signals generated within said at least one A/D paths in response to said D/A path output signals, wherein D/A calibration coefficients are determined.

* * * * *